(12) United States Patent
Cogoni et al.

(10) Patent No.: US 12,292,607 B2
(45) Date of Patent: May 6, 2025

(54) OPTICAL PACKAGE

(71) Applicants: STMicroelectrnoics (Alps) SAS, Grenoble (FR); STMicroelectronics (Grenoble 2) SAS, Grenoble (FR)

(72) Inventors: Deborah Cogoni, Notre Dame de l'Osier (FR); Raphael Goubot, Grenoble (FR); Younes Boutaleb, Grenoble (FR)

(73) Assignees: STMicroelectronics (Alps) SAS, Grenoble (FR); STMicroelectronics (Grenoble 2) SAS, Grenoble (FR)

( * ) Notice: Subject to any disclaimer, the term of this patent is extended or adjusted under 35 U.S.C. 154(b) by 455 days.

(21) Appl. No.: 17/735,653

(22) Filed: May 3, 2022

(65) Prior Publication Data

US 2022/0357536 A1    Nov. 10, 2022

(30) Foreign Application Priority Data

May 7, 2021    (FR) ...................................... 2104849

(51) Int. Cl.
*G02B 6/42*        (2006.01)
*G02B 6/43*        (2006.01)

(52) U.S. Cl.
CPC .......... *G02B 6/4272* (2013.01); *G02B 6/4274* (2013.01); *G02B 6/43* (2013.01)

(58) Field of Classification Search
CPC ....... G02B 6/4272; G02B 6/4274; G02B 6/43
USPC ......................................................... 385/14
See application file for complete search history.

(56) References Cited

U.S. PATENT DOCUMENTS

| 5,285,352 | A  |   | 2/1994  | Pastore et al. |
| 2016/0116695 | A1 | * | 4/2016 | Nekado ................ G02B 6/4249 385/14 |
| 2019/0148138 | A1 |   | 5/2019 | Molla et al. |
| 2019/0206759 | A1 | * | 7/2019 | Viswanathan .......... H01L 23/36 |
| 2020/0084875 | A1 |   | 3/2020 | Umeda et al. |
| 2021/0385560 | A1 | * | 12/2021 | Nagarajan .......... H04Q 11/0005 |

FOREIGN PATENT DOCUMENTS

TW    I692846 B    5/2020

OTHER PUBLICATIONS

INPI Search Report and Written Opinion for priority application, FR 2104849, report dated Nov. 30, 2021, 7 pgs.

* cited by examiner

*Primary Examiner* — Jerry M Blevins
(74) *Attorney, Agent, or Firm* — Crowe & Dunlevy LLC

(57) ABSTRACT

An optical package includes a substrate made of a first material having an upper surface and a lower surface. The substrate further includes at least one cavity opening onto an upper surface of the substrate. Electrical connection vias extend through the substrate. An electronic integrated circuit chip is mounted on the upper surface of the substrate in a position so as to cover the at least one cavity. The electronic integrated circuit chip includes an integrated optical sensor. Each cavity is filled with a second material having a thermal conductivity greater than the thermal conductivity of the first material. The electrical connection vias are arranged on either side of each cavity and between two cavities.

22 Claims, 6 Drawing Sheets

OPTICAL PACKAGE

PRIORITY

This application claims the priority benefit of French Application for Patent No. 2104849, filed on May 7, 2021, the content of which is hereby incorporated by reference in its entirety to the maximum extent allowable by law.

TECHNICAL FIELD

The present disclosure relates to the field of optoelectronics in general and, more specifically, to optical packages.

BACKGROUND

In general, optical packages are optoelectronic systems capable of converting light rays into electronic signals.

Typically, an optical package is a cavity-type package with a cover assembled to a substrate and a cavity between the cover and an optical sensor (and possibly an optical transmitter) positioned on (or integrated into) the substrate, generally via an electronic integrated circuit chip. The cover comprises (or is assembled with) a light-transparent structure, so that light rays can be received by the optical sensor through said transparent structure (and optionally light rays can be emitted by the optical transmitter through said transparent structure).

Optical package applications are multiplying, integrating more and more functions, for example to transmit and receive High Frequency (HF) signals, or to ensure the decoupling of the power supply (integration of numerous decoupling capacitors in particular), which requires the integration of more and more electronic components in the optical package, with more thermal power produced during operation as a corollary. In addition, optical sensors are becoming more and more efficient and accurate (increased detection distance, better resolution, improved pixel accuracy, etc.), which increases the pixel density and the thermal power generated during operation. The optical packages and/or the electronic components the optical packages integrate can be smaller and smaller, which increases the thermal power generated per unit area. Thus, there is a need to dissipate more and more thermal power within an optical package, in some cases in a smaller and smaller volume.

It is known to add a heat sink to the upper surface of an integrated circuit (by means of a connecting material). However, it is not possible to place such a heat sink on the optical package without obstructing the path of light rays.

There is a need for increased thermal power dissipation in an optical package.

SUMMARY

Embodiments herein address all or some of the drawbacks of known optical packages.

One embodiment provides an optical package comprising: a substrate made of a first material having an upper surface and a lower surface and comprising electrical connection vias extending through the substrate; an electronic integrated circuit chip having a lower surface assembled on the upper surface of the substrate, and an upper surface; an optical sensor integrated in the electronic integrated circuit chip or assembled on the upper surface of the electronic integrated circuit chip; wherein the substrate comprises at least one cavity opening at least onto the upper surface of said substrate, said cavity being filled with a second material having a thermal conductivity greater than the thermal conductivity of the first material; wherein the electronic integrated circuit chip is positioned on the substrate so as to cover said at least one cavity.

For example, the electrical connection vias may be at least partially positioned under the electronic integrated circuit chip.

According to one embodiment, the surface occupied by the at least one cavity filled with the second material is greater than or equal to 10% of the lower surface of the electronic integrated circuit chip in contact with the substrate, or even greater than or equal to 20% of the lower surface of the electronic integrated circuit chip in contact with the substrate, or even greater than or equal to 50% of the lower surface of the electronic integrated circuit chip in contact with the substrate.

One embodiment provides a substrate for an optical package, said substrate being made of a first material, having a top surface and a bottom surface and comprising: electrical connections; at least one cavity opening out onto at least the upper surface of said substrate; wherein the substrate is configured to receive an electronic integrated circuit chip above said at least one cavity.

For example, the at least one cavity of the substrate is filled with a second material having a thermal conductivity greater than the thermal conductivity of the first material.

The following embodiments apply, for example, to the optical package and to the substrate.

According to one embodiment, the second material has a thermal conductivity at least three times higher, or at least ten times higher, or even at least fifty times higher than the thermal conductivity of the first material.

According to one embodiment, the second material comprises a thermal interface material, such as a thermal paste.

According to one embodiment, the electrical connection vias are positioned on either side of the at least one cavity.

According to one embodiment, the substrate comprises a plurality of cavities.

According to one embodiment in which the substrate comprises a plurality of cavities, at least part of the electrical connection vias is positioned between two cavities.

According to one embodiment, the substrate is a Land Grid Array (LGA) substrate, such as an organic Land Grid array substrate (OLGA).

One embodiment provides a method for assembling an optical package comprising:

providing a substrate of a first material having at least one cavity and electrical connection vias extending through the substrate; filling the at least one cavity with a second material having a thermal conductivity greater than the thermal conductivity of the first material; positioning an electronic integrated circuit chip on the substrate so as to cover the at least one cavity, and assembling said chip to said substrate; and assembling an optical sensor on the electronic integrated circuit chip.

According to one embodiment, the method includes a step of forming at least one cavity in a substrate prior to the step of providing the substrate.

According to one embodiment, the method comprises a step of determining a boundary area for thermal power emitted by the electronic integrated circuit chip prior to the step of providing a substrate or forming at least one cavity, said at least one cavity being formed within the determined thermal power boundary area.

One embodiment provides for an electronic device comprising an optical package according to one embodiment.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail. In particular, the optical sensor is not detailed. It may be of the photodiode pixel array type, but other optical sensors (or image sensors) may be considered. The embodiments can be applied to any type of optical sensor. In addition, other electronic components potentially included in the optical package, as well as the various electrical connections, are not detailed.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures, or to an optical package as orientated during normal use.

It is clarified that when the bottom and upper faces are mentioned for the substrate or chip, this refers to the two opposite faces of said substrate or chip.

Unless specified otherwise, the expressions "around", "approximately", "substantially" and "in the order of" signify within 10%, and preferably within 5%.

Figure 1:
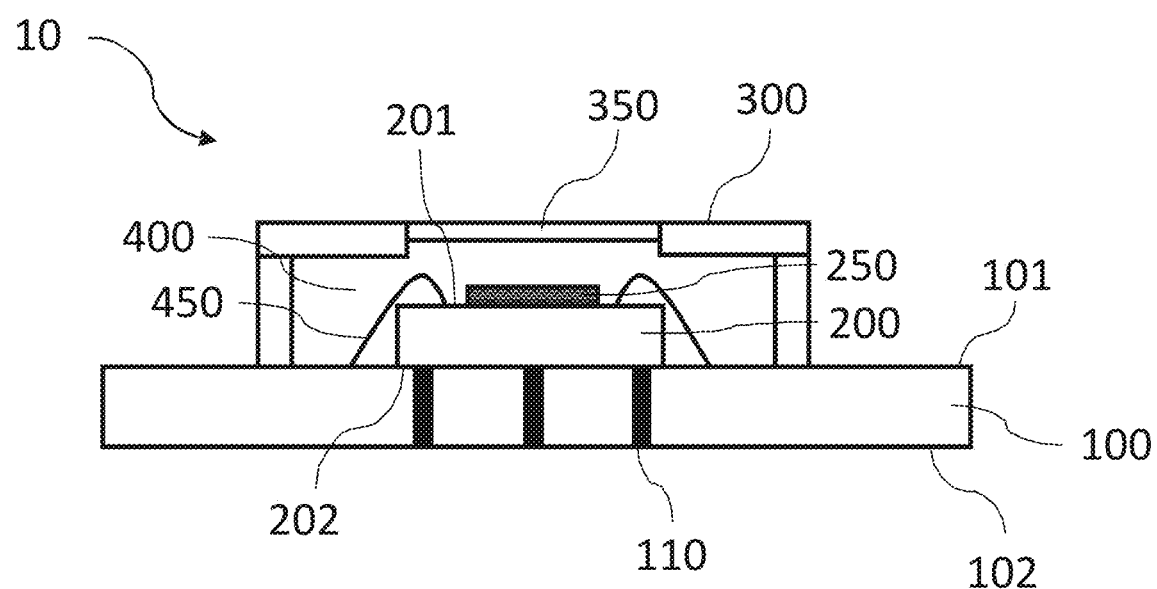
FIG. 1 shows a longitudinal section of an optical package.

FIG. 1 illustrates a longitudinal section of an optical package 10 comprising a cover 300 joined to a substrate 100. The substrate 100 is made of a first material. An electronic integrated circuit chip 200 is assembled on its bottom side 202 to the top side 101 of said substrate. An optical sensor 250 is integrated into the electronic integrated circuit chip 200 at the upper surface of said electronic integrated circuit chip or assembled on the electronic integrated circuit chip 200. The cover 300 is assembled with a light-transparent structure 350, configured so that light rays can be received through said transparent structure to the optical sensor. The transparent structure 350 is shown as a plate, although other shapes may be considered, including domed shapes. The space between the cover, the transparent structure and the optical sensor on the substrate forms a cavity 400. Said cavity may be filled with an at least partially transparent encapsulating material.

According to one embodiment, the cover and/or transparent structure may be omitted, and may be replaced with an encapsulating material that is at least partially transparent.

The electronic integrated circuit chip 200 is electrically connected to the upper surface 101 of the substrate 100 by conductive wires 450.

Conductive tracks and/or vias 110 (the conductive tracks and vias may be called "electrical connections") pass through the substrate in order to ensure electrical continuity at least between the lower surface 102 and the upper surface 101 of the substrate 100. The upper surface 101 of the substrate is coupled to the electronic integrated circuit chip 200, and thus also to the optical sensor 250, via the conductive wires 450. For example, the conductive tracks and/or vias 110 supply the electronic integrated circuit chip 200 with one or more ground potentials and/or supply voltages. The vias 110 are electrical connections extending vertically in, and passing through, the substrate, that is to say in a direction substantially perpendicular to the upper and lower surfaces of said substrate. The lower surface 102 of the substrate 100 may be coupled (directly or indirectly, via another substrate, for example) to a Printed Circuit Board (PCB).

In FIG. 1, only the vias have been shown, passing vertically through the substrate. Horizontal conductive tracks connected to vertical vias can also pass through the substrate so as to ensure electrical continuity between the upper and lower surfaces of the substrate. This may be the case when the substrate is multilayered, whereby horizontal conductive tracks may be formed between the layers, in the form of metallized layers for example, with vertical vias passing through the layers to connect the conductive tracks together.

In addition to an optical sensor, an optical package may comprise an optical transmitter. Further, although not shown, an optical package may include at least one additional electronic integrated circuit chip on which an additional optical sensor or optical transmitter is assembled.

The Inventors propose an improved optical package that can overcome some or all of the aforementioned drawbacks of known optical packages.

Figure 2:
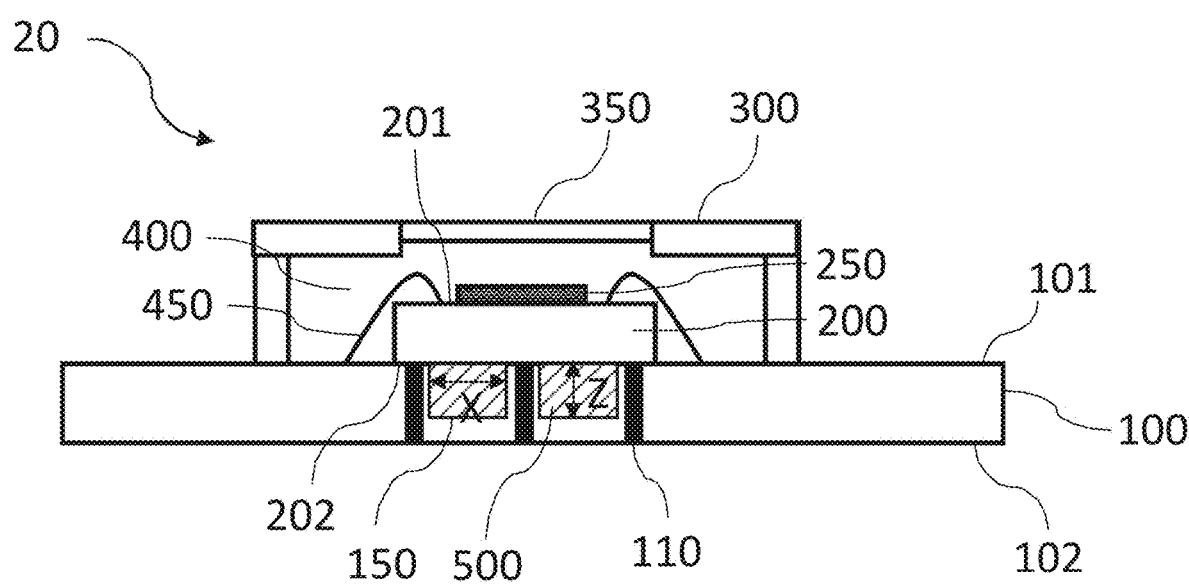
FIG. 2 shows a longitudinal section of an optical package according to one embodiment.
Figure 3:
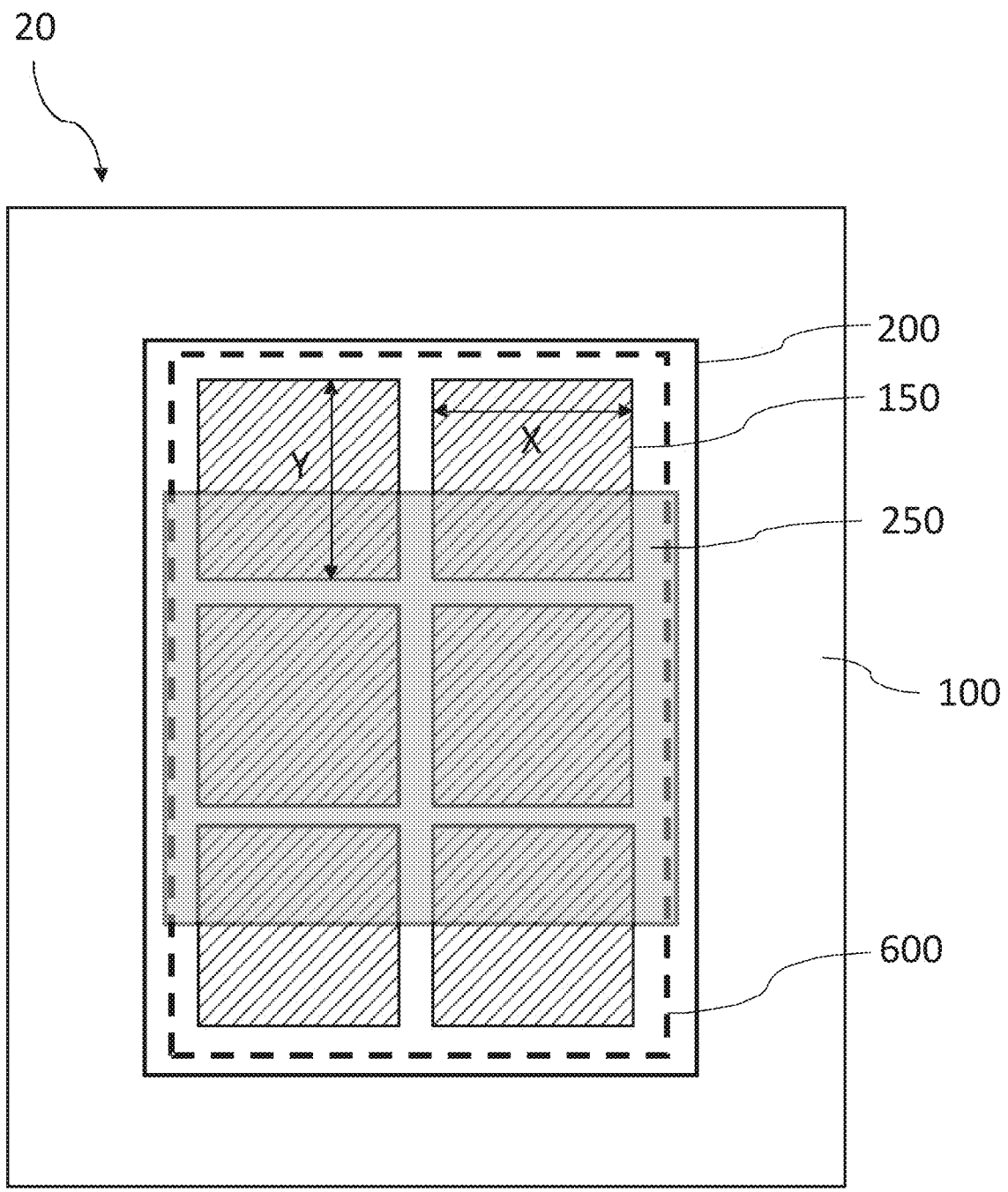
FIG. 3 shows a top view of the optical package according to the embodiment of FIG. 2.

FIGS. 2 and 3 show, in a longitudinal section and top view, respectively, an optical package 20 according to one embodiment. In the interest of clarity, for the top view, the cover, vias and leads have not been shown and the optical sensor is shown in transparency in order to clearly visualize the number and locations of cavities in the substrate.

The optical package 20 shown in FIGS. 2 and 3 incorporates the elements of FIG. 1. In addition, the optical package in FIGS. 2 and 3 differs from the optical package in FIG. 1 at least in that the substrate has a plurality of cavities 150 filled with a second material 500. FIG. 3 shows the presence of six cavities. The second material 500 has a higher thermal conductivity than the thermal conductivity of the first material. The cavities 150 filled with the second material are covered by the electronic integrated circuit chip 200. In other words, in these cavities, the first substrate material is replaced by a second material whose thermal conductivity is higher than that of the first substrate material, thus improving the thermal dissipation at the electronic integrated circuit chip. Indeed, the second material allows the heat generated by said electronic integrated circuit chip to be better conducted and to be dissipated, at least partially, through the substrate. In other words, this allows for improved thermal dissipation and consequently a reduction in the junction temperature of the electronic integrated circuit chip.

The second material may have a thermal conductivity that is at least three times the thermal conductivity of the first material, or at least ten times the thermal conductivity of the first material, or even at least fifty times the thermal conductivity of the first material.

FIG. 3 shows a dashed part 600, corresponding to a boundary area for thermal power emitted by the microchip. "Boundary area for thermal power" means an area greater than or equal to a thermal power threshold value. The threshold value is generally determined by calculation, specifically by software for calculating the power of an electronic integrated circuit chip (software well known to the person skilled in the field of microelectronics). The thermal power boundary area may correspond to a surface whose area is between the area of the optical sensor and the area of the electronic integrated circuit chip, as illustrated in FIG. 3.

It should be noted that the thermal power area may be in a single part (single area) or in multiple disjointed parts (multiple area).

Advantageously, the cavities 150 filled with the second material are positioned below the thermal power boundary area 600, in order to create a more efficient thermal path below the areas in which the thermal power is greatest.

The second material may be: a solder material, such as a tin/lead (Sn/Pb) alloy or a tin/silver (Sn/Ag) alloy; or a Thermal Interface Material (TIM), such as a thermal paste.

For example, the first material may have a thermal conductivity of less than 1 W/mK, and the second material may have a thermal conductivity of greater than 10 W/mK, or even greater than 20 W/mK.

Thus, the Inventors have determined that the presence of cavities filled with the second material allows for better thermal dissipation of the electronic integrated circuit chip and leads to a lower temperature rise (reduction in thermal resistance of the electronic integrated circuit chip).

Figure 4:
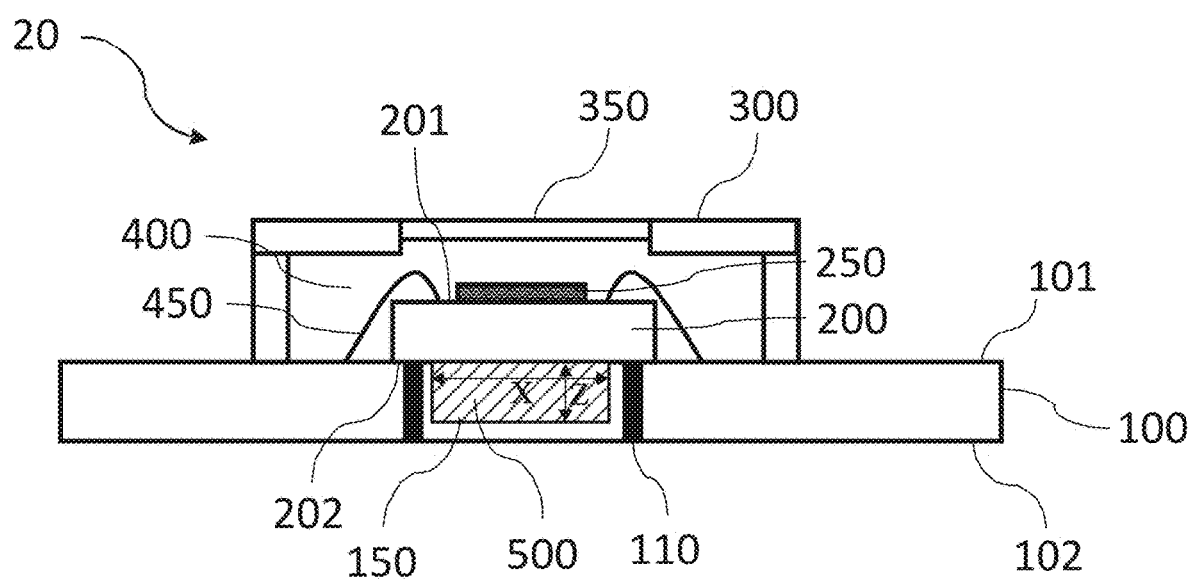
FIG. 4 shows a longitudinal section of an optical package according to another embodiment.
Figure 5:
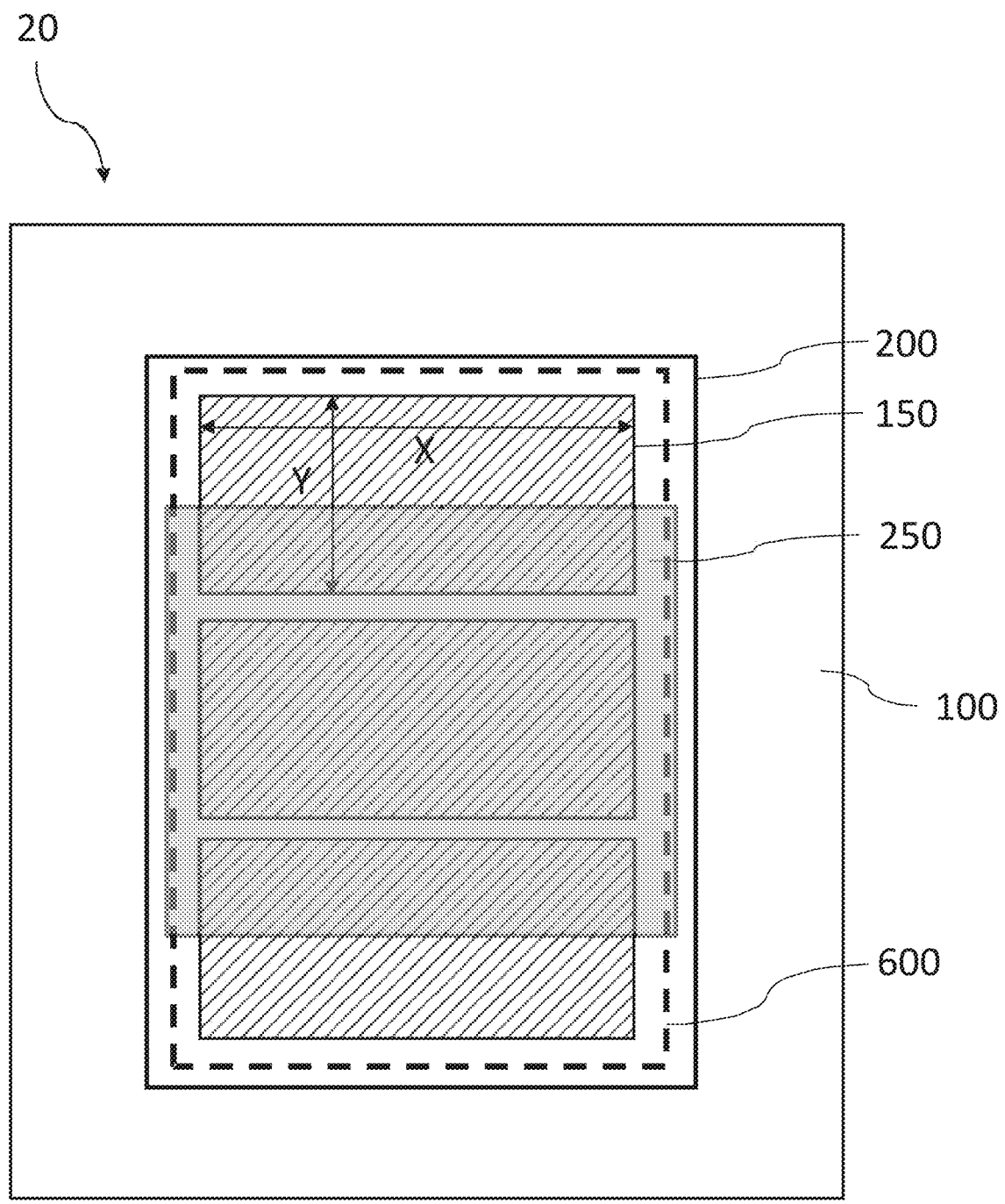
FIG. 5 shows a top view of the optical package according to the embodiment of FIG. 4.

FIGS. 4 and 5 show, in a longitudinal section and top view, respectively, another embodiment in which the cavities 150 are not separated by one or more vias 110, with these being positioned on either side of the cavities, and in which there are three cavities instead of six.

Some vias may advantageously be replaced by cavities filled with the second material, particularly if the latter is also electrically conductive. Preferably, vias are positioned under the chip at least, and are positioned on either side of the cavity (if only one cavity is provided) or the cavity assembly (if more than one cavity is provided).

Although six or three cavities are shown, the number of cavities under an electronic integrated circuit chip can vary, depending inter alia on the thermal power to be dissipated and the dimensions of the chip and the optical package. There may be a single cavity, or two, four, five or even more than six cavities under the electronic integrated circuit chip.

In addition, the X, Y, Z dimensions of the cavities can be adapted according to the number of cavities, the thermal power to be dissipated and the dimensions of the electronic integrated circuit chip and the optical package.

In one example, the surface occupied by the cavities filled with the second material represents at least 10% of the lower surface of the electronic integrated circuit chip in contact with the substrate, or at least 20%, or even at least 50%.

Cavities have been shown with dimensions X and Y that are adapted to spaces between the vias, with little clearance between the vias. More generally, the cavities may have dimensions adapted to the spaces between the electrical connections in the substrate, and the clearances between the electrical connections and the cavities may vary.

Cavities have been shown extending beyond the center of the substrate in the direction of height Z, but not opening onto the lower surface of the substrate. According to another embodiment, the cavities open onto the lower surface of the substrate. According to another embodiment, the cavities do not extend to the center of the substrate in the direction of height Z.

It is clear from the present description that the embodiments provide an optical package with improved thermal performance, more specifically thermal dissipation, by optimizing the package substrate design. This is a simple solution to implement that does not degrade the optical performance of said package. Further, the solution is flexible: the number and dimensions of the cavity or cavities can be adapted to the size of the optical package and the electronic integrated circuit chip, as well as to the thermal power to be dissipated. The second material can also be adapted according to the thermal power to be dissipated. Finally, the solution does not increase the thickness of the substrate, as the second material is inserted into the thickness of the substrate.

The optical package described with reference to FIGS. 2 to 4 can be made according to the following steps of an assembly method:

A) providing a substrate 100 containing cavities 150 and electrical connections 110;

B) filling the cavities 150 with a second material 500 of a thermal conductivity higher than the thermal conductivity of the substrate material (first material), using a standard cavity filling method, such as using a syringe or a pipette containing said second material; the filling may be accompanied by a movement adapted to distribute the second material in each cavity; the filling may further be followed by a planarization step, so that the second material forms a flat surface, flush with the edge of each cavity (to ensure the best possible thermal contact);

C) positioning an electronic integrated circuit chip 200 on the substrate 100 so as to cover the filled cavities 150 and assembling said electronic integrated circuit chip to said substrate;

D) making electrical connections between the electronic integrated circuit chip 200 and the substrate 100, by conductive wires 450, in some cases;

E) assembling an optical sensor 250 on the electronic integrated circuit chip 200, in some cases;

F) assembling the cover 300 on the substrate 100, in some cases; and

G) assembling a transparent plate 350 on the cover 300, in some cases.

The substrate may be made with cavities. In other cases, the substrate is made without the cavities. In these other cases, the method comprises a step of forming the cavities 150 in the substrate provided, prior to the filling step. The cavities may be formed by an etching method, for example.

The method may comprise a step of determining a thermal power boundary area 600 emitted by the electronic integrated circuit chip 200, prior to the step of providing a substrate 100 or the step of forming the cavities, the cavities then being formed below the determined thermal power boundary area.

FIGS. 1-5 show an optical package comprising an optical sensor. In addition to an optical sensor, the optical package may comprise an optical transmitter.

Further, as mentioned with reference to FIG. 1, the optical package may comprise at least one additional electronic integrated circuit chip on which an additional optical sensor or optical emitter is assembled. In this case, according to one embodiment, the optical package may comprise at least one additional cavity in the substrate below the additional electronic integrated circuit chip.

The number and size of the cavity (or cavities) may be tailored to different electronic integrated circuit chips for the same optical package.

According to one embodiment, the substrate can be a Land Grid Array (LGA) substrate. An LGA substrate is a type of surface mount substrate for integrated circuits that can be coupled to a larger electronic device substrate, such as a Printed Circuit Board (PCB), via flat electrical contacts at the lower surface of said substrate. The LGA substrate is further coupled to the electronic integrated circuit chip via lead wires 450 at the upper surface of said substrate. The LGA substrate may be made of multiple layers of dielectric material(s), such as two or four layers of dielectric material(s).

According to one particular embodiment, the substrate is an organic LGA (OLGA) substrate.

Figure 6:
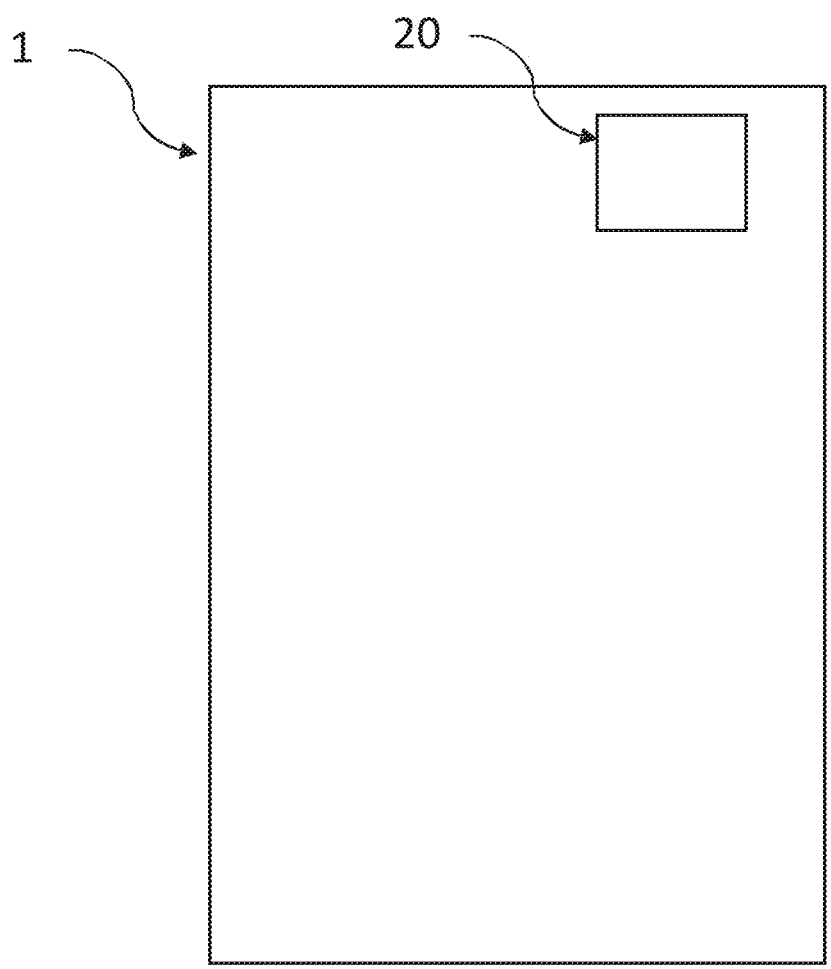
FIG. 6 shows an electronic device comprising an optical package.

FIG. 6 shows an electronic device 1 comprising an optical package 20 according to one embodiment. The electronic device may be a smartphone, a tablet, a laptop, a digital camera, etc.

Various embodiments and variants have been described. Those skilled in the art will understand that certain features of these embodiments can be combined and other variants will readily occur to those skilled in the art. In particular, the lid and/or transparent structure may be omitted, and optionally replaced with an at least partially transparent encapsulating material.

Finally, the practical implementation of the embodiments and variants described herein is within the capabilities of those skilled in the art based on the functional description provided hereinabove.

The invention claimed is:

1. An optical package, comprising:
   a substrate of a first material having an upper surface and a lower surface and comprising electrical connection vias extending through the substrate;
   an electronic integrated circuit chip having a lower surface assembled on the upper surface of the substrate, and an upper surface;
   an optical sensor integrated in the electronic integrated circuit chip or assembled on the upper surface of the electronic integrated circuit chip;
   the substrate comprising a plurality of cavities opening onto at least the upper surface of said substrate, each cavity of said plurality of cavities being filled with a second material, said second material having a thermal conductivity greater than the thermal conductivity of the first material, the electronic integrated circuit chip being positioned on the substrate so as to cover said plurality of cavities;
   wherein said electrical connection vias comprise first electrical connection vias arranged on either side of the plurality of cavities and second electrical connection vias arranged between two cavities of the plurality of cavities.

2. The optical package according to claim 1, wherein the electrical connection vias are at least partially positioned under the electronic integrated circuit chip.

3. The optical package according to claim 1, wherein a surface occupied by the plurality of cavities filled with the second material is greater than or equal to 10% of the lower surface of the electronic integrated circuit chip in contact with the substrate.

4. The optical package according to claim 1, wherein a surface occupied by the plurality of cavities filled with the second material is greater than or equal to 20% of the lower surface of the electronic integrated circuit chip in contact with the substrate.

5. The optical package according to claim 1, wherein a surface occupied by the plurality of cavities filled with the second material is greater than or equal to 50% of the lower surface of the electronic integrated circuit chip in contact with the substrate.

6. The optical package according to claim 1, wherein the second material has a thermal conductivity at least three times greater than the thermal conductivity of the first material.

7. The optical package according to claim 1, wherein the second material has a thermal conductivity at least ten times greater than the thermal conductivity of the first material.

8. The optical package according to claim 1, wherein the second material has a thermal conductivity at least fifty times greater than the thermal conductivity of the first material.

9. The optical package according to claim 1, wherein the second material comprises an electronic soldering material selected from the group consisting of: a tin/lead (SnPb) alloy and a tin/silver (SnAg) alloy.

10. The optical package according to claim 1, wherein the second material comprises a thermal interface material formed by a thermal paste.

11. The optical package according to claim 1, wherein the substrate is selected from the group consisting of: a Land Grid Array type of substrate and an Organic Land Grid Array type of substrate.

12. An electronic device comprising an optical package according to claim 1.

13. A substrate for an optical package, wherein said substrate is made of a first material and comprises:
   an upper surface and a lower surface;
   electrical connection vias extending through the substrate;
   a plurality of cavities opening onto at least the upper surface of said substrate;
   a second material having a thermal conductivity greater than the thermal conductivity of the first material that fills each cavity of the plurality of cavities;
   wherein said upper surface is configured to receive an electronic integrated circuit chip positioned above said plurality of cavities; and
   wherein said electrical connection vias comprise first electrical connection vias arranged on either side of the plurality of cavities and second electrical connection vias arranged between two cavities of the plurality of cavities.

14. The substrate according to claim 13, wherein the second material has a thermal conductivity at least three times greater than the thermal conductivity of the first material.

15. The substrate according to claim 13, wherein the second material has a thermal conductivity at least ten times greater than the thermal conductivity of the first material.

16. The substrate according to claim 13, wherein the second material has a thermal conductivity at least fifty times greater than the thermal conductivity of the first material.

17. The substrate according to claim 13, wherein the second material comprises an electronic soldering material selected from the group consisting of: a tin/lead (SnPb) alloy and a tin/silver (SnAg) alloy.

18. The substrate according to claim 13, wherein the second material comprises a thermal interface material formed by a thermal paste.

19. The substrate according to claim 13, wherein the substrate is selected from the group consisting of: a Land Grid Array type of substrate and an Organic Land Grid Array type of substrate.

20. A method for assembling an optical package, comprising:
provide a substrate made of a first material and having a plurality of cavities and electrical connection vias extending through the substrate and which are arranged on either side of the plurality of cavities and arranged between cavities of the plurality of cavities;
filling the plurality of cavities with a second material that has a thermal conductivity greater than the thermal conductivity of the first material;
positioning an electronic integrated circuit chip on the substrate so as to cover the plurality of cavities and said electrical connection vias;
wherein electronic integrated circuit chip comprises an optical sensor; and
assembling said electronic integrated circuit chip to said substrate.

21. The method according to claim 20, further including, prior to providing the substrate, forming said plurality of cavities in the substrate.

22. The method according to claim 20, further comprising, prior to providing the substrate, determining a boundary area for thermal power emitted by the electronic integrated circuit chip, wherein said plurality of cavities are formed below the determined thermal power boundary area.

* * * * *